United States Patent
Krzyzak

(10) Patent No.: US 8,643,369 B2
(45) Date of Patent: Feb. 4, 2014

(54) ANISOTROPIC DIFFUSION PHANTOM FOR CALIBRATION OF DIFFUSION TENSOR IMAGING PULSE SEQUENCES USED IN MRI

(76) Inventor: Artur Krzyzak, Krakow (PL)

( * ) Notice: Subject to any disclaimer, the term of this patent is extended or adjusted under 35 U.S.C. 154(b) by 582 days.

(21) Appl. No.: 12/994,760

(22) PCT Filed: May 19, 2009

(86) PCT No.: PCT/PL2009/000051
§ 371 (c)(1),
(2), (4) Date: Nov. 25, 2010

(87) PCT Pub. No.: WO2009/145648
PCT Pub. Date: Dec. 3, 2009

(65) Prior Publication Data
US 2011/0074423 A1 Mar. 31, 2011

(30) Foreign Application Priority Data

May 26, 2008 (PL) ........................................ 385276

(51) Int. Cl.
*G01V 3/00* (2006.01)
*G01R 33/48* (2006.01)
(52) U.S. Cl.
USPC ............ 324/318; 324/307; 324/309; 600/410
(58) Field of Classification Search
USPC .......................... 324/300–322; 600/406–464; 382/128–131
See application file for complete search history.

(56) References Cited

U.S. PATENT DOCUMENTS

| 8,134,363 B2* | 3/2012 | Yanasak et al. | 324/307 |
| 2004/0113615 A1* | 6/2004 | Bammer et al. | 324/307 |
| 2006/0195030 A1* | 8/2006 | Ogrezeanu et al. | 600/416 |
| 2012/0068699 A1* | 3/2012 | Horkay et al. | 324/300 |

OTHER PUBLICATIONS

Raguin L G et al:"Quantitative Analysis of q-Space MRI Data" IFMBE Proceedings, International Federation for Medical and Biological Engineering, vol. 11, 1, Nov. 20, 2005, pp. 6pp.

(Continued)

*Primary Examiner* — Melissa Koval
*Assistant Examiner* — Emily Chan
(74) *Attorney, Agent, or Firm* — Mark M. Friedman

(57) ABSTRACT

The subject matter of the invention concerns the anisotropic diffusion phantom for the calibration of any diffusion MR-DTI imaging sequence and a method for the calibration of all the MRI scanners by using anisotropic diffusion models based on the "b" matrix, which is a quantity specific for every magnetic resonance (MR) imaging sequence and the MRI scanner used. It has application in the study of solids, amorphous materials, liquids and biological tissues. The anisotropic diffusion phantom for the calibration of any MR imaging sequence is any anisotropic diffusion model of any shape for the hydrogen $H_2$ contained in $H_2O$ or LC, for example. The diffusion standard according to the invention is preferably a pipe with a bundle of capillaries filled with $H_2O$, hydrogel or any other substance that contains hydrogen nuclei or any volume, preferably cylindrical, filled with $H_2O$, hydrogel or any other substance that contains hydrogen nuclei or densely filled with non-magnetic cylindrical rods free of hydrogen nuclei.

5 Claims, 1 Drawing Sheet

(56) References Cited

OTHER PUBLICATIONS

Tamir J E et al :"Restricted self-diffusion of protons in colloidal systems by the pulsed-gradient, spin-echo method" Journal of Chemical Physics, American Institute of Physics, New York, NY, US, vol. 49, No. 4. Aug. 15, 1968, pp. 1768-1777.

Yanasak et al :"Use of capillaries in the construction of an MRI phantom for the assessment of diffusion tensor imaging : demonstration of performance" Magnetic Resonance Imaging, Elsevier Science, Tarrytown, NY, US, vol. 24, No. 10 ,Dec. 1, 2006, pp. 1350, col. 2, p. 1351, col. 2, figures 1, 2.

Tournier J D et al :"Resolving crossing fibers using constrained spherical deconvolution : Validation using diffusion-weighted imaging phantom data" Neuroimage, Academic Press, Orlando, FL, US vol. 42, No. 2,9, May 9, 2008. pp. 617-625.

Fieremans et al:"Simulation and experimental verification of the diffusion in an anisotropic fiber phantom" Journal of Magnetic Resonance, Academic Press, Orlando, FL, US, vol. 190. 2, Nov. 1, 2007, pp. 189-199.

Callaghan et al:"Pulsed-Gradient Spin-Echo NMR for Planer, Cylindrical, and Spherical pores under Conditions of wall Relaxation" Journal of Magnetic Resonance, Series A. Academic Press, Orlando, FL, US, vol. 113. No. 1, Mar. 1, 1995, pp. 53-59.

\* cited by examiner

ANISOTROPIC DIFFUSION PHANTOM FOR CALIBRATION OF DIFFUSION TENSOR IMAGING PULSE SEQUENCES USED IN MRI

RELATED APPLICATIONS

This patent application is a U.S. National Phase Application of PCT/PL2009/000051 filed on May 19, 2009, which claims priority of Polish Patent Application P.385276 filed May 26, 2008, the contents of which are incorporated herein by reference.

BACKGROUND

The subject matter of the invention concerns the anisotropic diffusion phantom for the calibration of any diffusion MR-DTI imaging sequence and a method for the calibration of any Magnetic Resonance Imaging (MRI) scanner by using anisotropic diffusion models based on the "b" matrix, which is a quantity specific for every magnetic resonance (MR) imaging sequence and MRI scanner that are used, employed in the examination of biological tissues, solids, amorphous materials and liquids.

In the prior art, the values of the "b" matrix that were needed to calculate the diffusion tensor were determined analytically and separately for every diffusion MR imaging sequence and MRI scanner; the results were approximate only due to the complex formulae used in the calculation. Alternatively, a single value of the "b" matrix that was assumed for the entire volume of the object in question was used for the calculation of the diffusion tensor.

A disadvantage of the diffusion tensor calculation methods known in the art is the large contribution of calculation errors as the approximate "b" matrix values are used and a lack of any spatial distribution of the "b" matrix is assumed. Therefore, it is rather difficult to determine the water diffusion fluctuations in the object examined by using an MRI scanner properly, precisely and quantitatively, and the reproducibility of the results is non-existent. Distinct MR sequences occur for various MRI scanners; in consequence, the results are discrepant and hardly comparable. The results are fraught with errors as it is impossible to precisely determine the "b" matrix values.

BRIEF DESCRIPTION OF DRAWINGS

Attention is now directed to the drawings, where like reference numerals or characters indicate corresponding or like components. In the drawings.

DETAILED DESCRIPTION OF THE DRAWINGS

Figure 1:
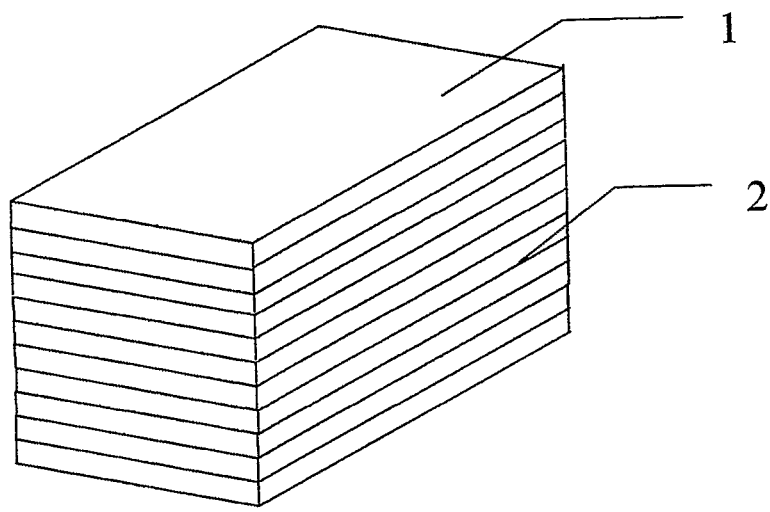
FIG. 1 shows an outline of an anisotropic diffusion phantom in accordance with an embodiment of the invention.

The following acronyms will be used throughout the document:
MR—Magnetic Resonance
DTI—Diffusion Tensor Imaging
LC—Liquid Crystal A calibration method of the invention for any MRI scanner eliminates these shortages and enables the precise and spatial determination of "b" matrix values for any MRI scanner and any imaging sequence, in particular DTI.

In the method of the invention, the "b" matrix is determined precisely based on the anisotropic diffusion model, for each voxel of the volume tested.

The anisotropic diffusion phantom for the calibration of any MR imaging sequence of the invention is any anisotropic diffusion model of any shape for the hydrogen contained in $H_2O$ or in LC, for example. The diffusion model according to the invention is preferably a pipe with a bundle of capillaries filled with $H_2O$, hydrogel or any other substance that contains hydrogen. Other 3D shapes, preferably cylindrical, filled with densely non-magnetic cylindrical rods without hydrogen nuclei could be regarded as a reference diffusion model as well. The rods are preferably made of glass, Teflon or any other material with similar properties. They are immersed in $H_2O$, hydrogel or any other substance that contains hydrogen nuclei. In one embodiment, the diffusion model is an array of thin glass plates separated by the layers of $H_2O$, hydrogel or any other substance that contains hydrogen nuclei. The diffusion model can also be formed by anisotropic liquid crystals (LC) or others for other elements that may be used in imaging in future, such as for example $^2H$, $^3He$, $^{13}C$, $^{14}N$, $^{17}O$, $^{19}F$, $^{29}Si$, $^{31}P$, etc. The model, being a pipe with a bundle of capillaries, has the capillaries selected so that the restriction of diffusion at a temperature in the direction perpendicular to the capillary axis is significant with respect to the range of diffusion times Δ in the diffusion MR imaging sequence. For the diffusion model filled with water at ambient temperature, it is within a range of 0.1 μm to 100 μm. For hydrogel, the values are lower. The free diffusion of water molecules across the capillaries or across the cylindrical rods or perpendicularly to the plane of the thin glass plates is inhibited by the opposite capillary or rod wall or by the plane of the opposite thin glass plate and restricts the diffusion process. By adjusting the capillary diameters, cylindrical rod diameters or the thickness of the layers of $H_2O$, hydrogel or any other substance that contains hydrogen nuclei between thin glass plates, the diffusion limit is determined for specified diffusion times Δ and temperature T based on the fact that free diffusion is given by the Einstein-Smoluchowski equation:

$$\langle (\vec{r} - \vec{r}_o)(\vec{r} - \vec{r}_o) \rangle = 6Dt \quad [1]$$

where:
$\vec{r}$—position vector of the diffusing molecule at time t,
$\vec{r}_o$—initial position vector.

The equation determines the relation between the average square of the path and the diffusion coefficient D.

The anisotropic diffusion model in the system of principal axes has no less than two distinct diffusion tensor components, wherein for the phantom made of a bundle of capillaries it is a symmetrical diffusion tensor D:

$$\begin{pmatrix} D_{xx} & D_{xy} & D_{xz} \\ D_{yx} & D_{yy} & D_{yz} \\ D_{zx} & D_{zy} & D_{zz} \end{pmatrix}$$

which obtains the following form after diagonalisation in the system of the principal axes:

$$\begin{pmatrix} D_1 & 0 & 0 \\ 0 & D_2 & 0 \\ 0 & 0 & D_3 \end{pmatrix}$$

where:
$D_{ij}$—components of the symmetrical diffusion tensor in the laboratory system, $D_1$, $D_2$—diffusion coefficients determined in the transverse direction of the capillary, $D_3$—diffusion coefficient in the longitudinal direction of the capillary.

In the case in question: $D_1=D_2$ and $D_2 \neq D_3$.

In the present invention, the anisotropic diffusion model is determined as follows:

typical one-dimensional experiments are carried out for the measurement of the diffusion coefficients for the anisotropy directions in order to determine e.g. $D_1$, $D_2$ and $D_3$ depending on the diffusion time and temperature. Thus, an anisotropic diffusion model is obtained, being a function of temperature T and diffusion time $\Delta$.

Any MRI scanner can be calibrated by using the method of the invention in order to measure the "b" matrix precisely and spatially. It leads consequently into a precise measurement of the diffusion tensor assuming that in biological tissues it is primarily the water diffusion tensor.

The diffusion tensor is measured according to the known formula:

$$\ln\left(\frac{A(b)}{A(0)}\right) = -\sum_{i=1}^{3}\sum_{j=1}^{3} b_{ij} D_{ij} \qquad [2]$$

where:

A(b)—echo signal (MR image intensity), measured for each voxel,

A(0)—MR image intensity for b=0, $b_{ij}$—element of the symmetrical "b" matrix, $D_{ij}$—element of the symmetrical diffusion tensor D.

It follows from formula [2] that for the DTI experiments, in order to calculate the water diffusion tensor, wherein the symmetrical tensor is a 3×3 matrix, no less than seven MR experiments need to be carried out, for which the MR sequences shall contain six distinct non-collinear directions of diffusion gradients and one (the seventh) direction without diffusion gradients applied. Hence, for the simplest DTI experiment, no less than six symmetrical "b" matrices, each of which contains six distinct components, are determined for each diffusion gradient vector.

For the calibration of any MR imaging sequence by using the anisotropic diffusion phantom of the invention, the anisotropic diffusion phantom is placed inside the volume of the MRI scanner tested. Subsequently, the number of "b" matrices needed for the calculation of the diffusion tensor is determined based on the anisotropic diffusion model. This constitutes no less than six "b" matrices to be defined spatially for each voxel and for the specific directions of the diffusion gradient vector. Therefore, in the simplest case, 36 "b" matrices and one "$b_0$" matrix—without diffusion gradients—are determined.

In order to determine the value of the "b" matrix for the direction of the diffusion gradient vector, a system of no less than six equations is solved for the distinct diffusion tensor D values. For a diffusion gradient vector direction, a diffusion tensor value is used based on the specified diffusion model for the diffusion time $\Delta$ and the temperature of the respective experiment. Various diffusion model tensor values are preferably obtained by rotating the anisotropic diffusion phantom inside the MRI scanner volume in question. The anisotropic diffusion phantom is a diffusion model for which the diffusion tensor in the system of the principal axes assumes known values. The diffusion model is rotated by various Euler angles, so that the determinant $D_M$ of the matrix, whose columns correspond to the components of the diffusion tensor D is different from zero after each rotation.

$$\det(D_M) \neq 0$$

The following matrix is derived in the measurements:

$$D_M = \begin{pmatrix} D_{11} & D_{12} & D_{13} & D_{14} & D_{15} & D_{16} \\ D_{21} & D_{22} & D_{23} & D_{24} & D_{25} & D_{26} \\ D_{31} & D_{32} & D_{33} & D_{34} & D_{35} & D_{36} \\ D_{41} & D_{42} & D_{43} & D_{44} & D_{45} & D_{46} \\ D_{51} & D_{52} & D_{53} & D_{54} & D_{55} & D_{56} \\ D_{61} & D_{62} & D_{63} & D_{64} & D_{65} & D_{66} \end{pmatrix},$$

where for $D_{ij}$:

i—successive components of the diffusion tensor: xx, yy, zz, xy, xz, yz, j=in the range of 1 to 6—successive sets of Euler angles.

For the calculation of the "b" matrix values for a direction of the diffusion gradient vector, the following system of equations is solved, derived from equation [2]:

$$L = bD_M, \qquad [3]$$

where:

b—six calculated components of the "b" matrix converted into the vector form, $D_M$—matrix whose columns are formed by the components of the model diffusion tensor after successive rotations by various Euler angles, L—successive $$\ln\left(\frac{A(b)}{A(0)}\right)$$

values from measurements (based on MR images) converted into the form of a transposed vector.

The system of equations [3] is solved for the remaining (no less than six non-collinear) directions of diffusion gradients. Thus, 36 "b" matrices and a "$b_0$" matrix are derived. Therefore, the "b" matrix values are obtained for the specific directions of diffusion gradients and for each voxel of the volume in question.

Based on the calibration method of the invention, a diffusion model for the volume examined is formed and selected for an RF coil depending on its shape and parameters. The calibration is repeated every time before the change of the imaging sequence parameters, in particular when changing the diffusion gradients.

The advantage of the calibration method for any MRI scanner using anisotropic diffusion models based on the anisotropic diffusion phantom for the calibration of any diffusion MR-DTI imaging sequence is the precise and spatial determination of the "b" matrix value. As a result it is possible, contrary to the prior art, to precisely measure the diffusion tensor, first of all in biological systems, but also in other systems. Furthermore, the calibration method provides a real possibility to compare the diffusion tensor values for the objects tested, which are derived by using various MRI scanners and distinct MR imaging sequences.

EXAMPLE

The following operations were performed for the calibration of an MSED (Multislice Spin Echo Diffusion) sequence in an MRI scanner with a superconducting magnet (field intensity: 4.7 T) by using an anisotropic diffusion model at T=21° C. and diffusion time Δ=50 ms:

1. An anisotropic diffusion phantom in the form of an array of thin glass plates separated with H₂O layers (thickness: 10 μm) was placed in an MRI scanner with a superconducting magnet (field intensity: 4.7 T) in the influence area of a 3 cm birdcage RF coil. Tomographic measurements were carried out by using an MSED sequence.
2. MR tomographic measurements for the determination of the spatial "b" matrix for one direction of the diffusion gradient vector were carried out for six distinct positions defined by the rotation of the anisotropic diffusion phantom by Euler angles. The entire measurement volume tested in the MRI scanner in the interaction area of the RF coil was scanned to obtain the spatial distribution of the "b" matrix. The measurements were repeated for further diffusion gradient vector directions. A total of 36 MR measurements were carried out in six distinct diffusion gradient vector positions and an additional scan for the diffusion gradient vector=0.
3. Subsequently, the operations in steps 1 and 2 were repeated for the other sequence parameters; as a result, a digital record of the spatial "b" matrix values was derived that corresponded to various imaging sequence parameters. The "b" matrix values, thus obtained, enabled the precise calculation of the diffusion tensor by using a DTI sequence in the parameter range for which the "b" matrix value was determined.

Figure 2:
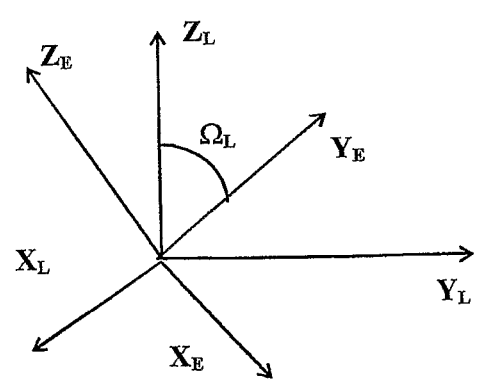
FIG. 2 is a diagram of a laboratory reference system.

The anisotropic diffusion phantom and calibration method for any MR imaging sequence according to the embodiment is shown in the figure, wherein FIG. 1 shows the outline of the anisotropic diffusion phantom in the form of an array of thin glass plates separated with H₂O layers and FIG. 2 shows the phantom (diffusion model) rotation method by successive Euler angles.

The anisotropic diffusion phantom is made from thin glass plates 1, each of which is separated with a 10 μm H₂O layer 2. The system of principal axes (E) shown in FIG. 2 is the laboratory reference system (L) related to the diffusion model after rotation and their mutual orientation as defined by the Euler angles $$\Omega_L = (\alpha_L, \beta_L, \gamma_L).$$

Due to the symmetry, the diffusion tensor measured in the laboratory system (L) has 6 components different from zero. In the system of principal axes (E), the diffusion tensor is defined by three principal components and three Euler angles $\Omega_L$. For a known tensor in the system of principal axes (E) and known Euler angles, the tensor values in the laboratory system (L) are determined by a rotation transformation $R(\alpha_L, \beta_L, \gamma_L)$ according to the formula:

$$D_L = R^{-1}(\Omega_L) D_E R(\Omega_L)$$

where:
$R(\Omega_L)$—Wigner rotation matrix,
$\Omega_L = (\alpha_L, \beta_L, \gamma_L)$—Euler angles that define the orientations of the system of principal axes (E) with respect to the laboratory system (L),
$D_L, D_E$—diffusion tensors in L and E systems, respectively.

The diffusion model is rotated by various Euler angles, so that the determinant $D_M$ of the matrix, whose columns correspond to the components of the diffusion tensor D, is different from zero after each rotation.

$$\det(D_M) \neq 0$$

The invention claimed is:

1. A method for calibration of a Magnetic Resonance-Diffusion Tensor Imaging(MR-DTI) sequence for a Magnetic Resonance Imaging (MRI) scanner, comprising the steps of:

providing an anisotropic diffusion phantom having a diffusion tensor with known values in an interaction area of an Radio Frequency (RF) coil in a volume of the MRI scanner to be examined, rotating the anisotropic diffusion phantom by at least six Euler angles and for each rotated position of the anisotropic diffusion phantom, measuring, for each voxel of the volume of the MRI scanner to be examined, a Magnetic Resonance (MR) image intensity for no diffusion gradient applied and an MR image intensity for each of at least six distinct non-collinear directions of a diffusion gradient, on the basis of the MR image intensities, which were measured, and the known values of the diffusion tensor, determining a symmetrical "b" matrix for each of at least six distinct non-collinear directions of diffusion gradient for each voxel of the volume of the MRI scanner using the equation:

$$\ln(A(b)/A(0)) = -\sum_{i=1}^{3} \sum_{j=1}^{3} b_{ij} D_{ij},$$

wherein:
A(b) represents the MR image intensity for a given direction of diffusion gradient,
A(0) represents the MR image intensity for no diffusion gradient applied,
b represents the symmetrical "b" matrix,
D represents the diffusion tensor, and
i, j represent directions of diffusion gradients, and
for each voxel, providing the set of at least six symmetrical "b" matrices to be used for determining diffusion tensor in subsequent MR-DTI experiments using the calibrated MR-DTI sequence for the MRI scanner.

2. The method according to claim 1, wherein the anisotropic diffusion phantom is rotated by at least six various Euler angles so that after each rotation, for a matrix having elements corresponding to the components of the diffusion tensor for the distinct Euler angles the determinant of the matrix det ($D_M$) is different from zero.

3. The method according to claim 1, wherein the diffusion tensor D includes diffusion tensors $D_1, D_2, D_3$, and the values of the diffusion tensors are determined in the system of principal axes as a function of temperature T and diffusion time Δ.

4. The method according to claim 1, wherein the anisotropic diffusion phantom is formed and selected for the RF coil depending on its shape and parameters.

5. The method according to claim 1, wherein the calibration is performed after a change of parameters of the MR-DTI sequence, including after the change of diffusion gradients.

* * * * *